United States Patent [19]

Progler et al.

[11] Patent Number: 5,452,090
[45] Date of Patent: Sep. 19, 1995

[54] CCD BASED CONFOCAL FILTERING FOR IMPROVED ACCURACY IN X-RAY PROXIMITY ALIGNMENT

[75] Inventors: Christopher J. Progler, Waterbury, Conn.; Alan E. Rosenbluth, Yorktown Heights, N.Y.

[73] Assignee: International Business Machines Corporation, Armonk, N.Y.

[21] Appl. No.: 231,854

[22] Filed: Apr. 22, 1994

Related U.S. Application Data

[63] Continuation of Ser. No. 875,517, Apr. 29, 1992, abandoned.

[51] Int. Cl.⁶ .............................................. G03B 3/00
[52] U.S. Cl. .................................... 356/401; 250/548
[58] Field of Search ........................... 355/53, 26, 89; 356/399, 400, 401; 250/548, 557

[56] References Cited

U.S. PATENT DOCUMENTS

| | | | |
|---|---|---|---|
| Re. 32,660 | 5/1988 | Lindow et al. | 250/201 |
| 4,221,487 | 9/1980 | Lacombat et al. | 356/394 |
| 4,491,964 | 1/1985 | Sanner | 382/50 |
| 4,614,431 | 9/1986 | Komeyama | 356/401 |
| 4,663,534 | 5/1987 | Ayata et al. | 250/548 |
| 4,672,557 | 6/1987 | Tamura et al. | 364/490 |
| 4,704,027 | 11/1987 | Phillips | 355/43 |
| 4,774,666 | 5/1988 | Oshida et al. | 356/401 |
| 4,814,829 | 3/1989 | Kosugi et al. | 355/43 |
| 4,865,455 | 9/1989 | Kohno et al. | 356/400 |
| 4,947,413 | 8/1990 | Jewell et al. | 378/34 |
| 5,047,609 | 9/1991 | Ekstrand | 356/401 X |
| 5,048,967 | 9/1991 | Suzuki et al. | 356/401 |
| 5,048,968 | 9/1991 | Suzuki | 356/401 |
| 5,067,805 | 11/1991 | Corle et al. | 359/235 |
| 5,172,189 | 12/1992 | Mitome | 356/401 |

FOREIGN PATENT DOCUMENTS

0410634A2  1/1991  European Pat. Off. .

OTHER PUBLICATIONS

M. D. Levenson, et al., "Confocal Microscope with Fabry–Perot Filter" IBM Technical Disclosure Bulletin, vol. 31, No. 1, pp. 265–267 (Jun. 1988).

A. Starikov, et al., "Use of a Priori Information in Centerline Estimation" Proceedings KTI Microlithography Seminar, Oct. 14–15, 1991 pp. 277–285.

*Primary Examiner*—Robert J. Warden
*Assistant Examiner*—E. Leigh Dawson
*Attorney, Agent, or Firm*—Charles W. Peterson, Jr.

[57] ABSTRACT

In a reverse darkfield (RDF) microlithography alignment system a confocal spatial filtering system discriminates against topographical features other than the alignment mark. A CCD detector array provides flexible confocal filtering via a pixel weighting matched to the optical system. The confocal filtering system employs empirical filter optimization accomplished by correlating stored images with resulting overlays. The empirical optimization of the filter reweights the CCD array and correlates back to measured overlay results. This not only enhances the proven process insensitivity of RDF systems, but combines it with the improved resolution and noise rejection of confocal imaging. Alternatively the means for confocal spatial filtering is comprised of a filter matched to the instantaneous image of an alignment target; for example, a double slit filter matched to the image of a single alignment mark edge.

11 Claims, 9 Drawing Sheets

POLYIMIDE

NO FILTER

MEMBRANE

NO FILTER

POLYIMIDE

NO FILTER

MEMBRANE

NO FILTER

CCD BASED CONFOCAL FILTERING FOR IMPROVED ACCURACY IN X-RAY PROXIMITY ALIGNMENT

The application is a continuation of application Ser. No. 07/875,517, filed Apr. 29, 1992, now abandoned.

BACKGROUND OF THE INVENTION

1. Field of the Invention This invention relates to alignment systems for lithography and more particularly to darkfield alignment systems.

2. Description of Related Art

Reverse darkfield (RDF) alignment systems measure the total light scattered by an object that is scanned beneath a projected spot of light. The total energy contained in the image of the spot then forms the alignment signal, which is measured as a function of position during the scan. The optics are configured in such a way as to exclude specularly reflected light from the target. This is often accomplished with an annular mirror that causes the image at the detector to be formed only from light that is scattered by features within the illuminated volume. Light reflected from featureless flat regions of the substrate is not collected by the mirror.

These systems are considerably less sensitive than bright field systems to extraneous topography that may be present in the vicinity of alignment mark edges, such as the modulation induced by the mark in the overcoating resist layer, or topography from previous process levels. Scanned systems permit small-field imaging as well, which provides relief from off axis lens aberrations and the associated errors in alignment mark position. Small-field imaging also makes scanned systems less vulnerable to stray-light than systems using full-field illumination. A distinction is sometimes made between stray-light scattered by extraneous features at a large distance (vertically and horizontally) from objects of interest, and the extraneous signals scattered from features in very close proximity to the mark edge.

Even in state-of-the-art RDF (reverse darkfield) systems, both kinds of scattered light contribute to an erroneous background signal. This background signal will result in alignment offsets, if not adequately discriminated from alignment mark signals. Under most conditions the mark edge will produce a reasonably clear pulse of scattered energy at the detector as the edge scans through the central peak of the scanned spot. However, this pulse must be registered to within a very small fraction of its width in order to meet alignment tolerances for sub-0.5 μm lithography. Thus, relatively weak extraneous signal modulation from more dimly illuminated scattering features can still produce an unacceptably large offset in the perceived mark position. A clear indication of this vulnerability can be found in the common observation that the measured edge-response of lithographic alignment systems is very much broadened when the test object is a resist coated step. Under unfavorable conditions, the accumulated scattering from grainy films and the like can completely obscure the signal from the mark edge.

X-ray lithography alignment systems have a particular vulnerability in this regard, due to the the close proximity of the mask and the wafer. In such cases, the illuminated region must be regarded as a three-dimensional cone having substantial volume, even though the cross-sectional area in the image plane is quite narrow. For example, when an x-ray alignment system views the wafer marks through mask windows, scattered and specular noise from the mask corrupts the information in the wafer alignment signal, leading to significant background noise (FIG. 1). Currently available commercial alignment systems suffer from a related sensitivity in that the wafer alignment grating is viewed directly through the mask alignment grating; and both gratings scatter light into the image plane simultaneously. FIG. 1 shows the manifestation of optical stray light in a prior art system with a wafer 10, and a mask 11 with an aperture 12 therethrough. An illumination ray 14 is directed through aperture 12 to hit wafer 10. The ray 14 is reflected up as beam 14'. Specular noise "beams" 15 are reflected from the surface of the mask at the aperture 12, backscattered noise 15 is also reflected from the surface of the mask 11 at the aperture, and forward scattered noise 17 passes to the wafer 10 where it is reflected as scattered noise 18 which passes back through the aperture 12 above mask 11. The beam 14', as well as the specular noise 15 and scattered noise 18 all pass toward collection area 19 above mask 11. The mask specular noise "beams" 15 and scattered noise 18 corrupt the aligner signal. As the gap is lower, (40 μm→20 μm), the problem of scatter and corruption of the alignment signal increases.

U.S. Pat. No. 4,672,557 of Tamura et al is not confocal and does not use darkfield illumination. The CCD processing used does not use the same principle. A different signal processor is described.

U.S. Pat. No. 4,814,829 of Kasugi et al does not use confocal spatial filtering and it uses a standard darkfield system. Filtering is in the pupil plane, not the image plane. Furthermore, the shape of the filter is not matched to the instantaneous image of the alignment mark.

U.S. Pat. No. 4,663,534 of Ayata et al is not confocal, i.e. the filtering aperture is not sub-resolution to the imaging system. This embodiment is similar to '829.

U.S. Pat. No. 4,614,431 of Komeyama relates to a dual focus alignment system for proximity alignment.

U.S. Pat. No. 4,744,666 of Oshida et al is not confocal and "out of conjugate relation" (Col. 1, line 60)

U.S. Pat. No. 4,947,413 of Jewell et al filters in the diffraction plane. Spatial filtering is done in the frequency domain and not in image space as our invention proposes.

In accordance with this invention, a microlithography alignment system:
 a. employs a reverse darkfield configuration, and
 b. includes means for confocal spatial filtering, whereby the optical signal is improved and alignment offsets are reduced, providing a confocal darkfield alignment system.

Preferably the means for confocal spatial filtering employs a two dimensional CCD detector array or diode array detectors as a confocal filter. In one aspect of the invention the means for confocal filtering employs empirical optimization of the filter by reweighting the CCD array and correlating back to measured overlay results. Alternately, the filter pixel weighting can be optimized based on an alignment signal Figure of Merit. This Figure of Merit can be based on either the alignment signal symmetry and peak amplitude or based on information known a priori in the alignment target design.

An example of a Figure of Merit based on a prior information can be found in "Use of A Priori Information in Centerline Estimation" by A. Starikov, A. D.

Lopata and C. H. Progler, Proceeding of the Microlithography Seminar, Interface '91, 277–285 (1991) Here, alignment signal symmetry, redundancy and statistics are used to assess the validity and quality of acquired alignment data. The confocal darkfield pixel weighting can be done in real time to improve these attributes of the alignment data.

Many standard estimates of signal symmetry such as comparing opposing edge slopes or scattered amplitude of opposing edges can also be used as a Figure of Merit during window optimization.

In another aspect of the invention, the confocal spatial filtering employs a quadrant detector as a confocal filter.

In the configuration where the filter is matched to the instantaneous darkfield image of a single alignment mark edge, the means for confocal spatial filtering is comprised of a filter consisting of a double slit.

Instead of matching the pixel weighting to the confocal darkfield instantaneous image of a single isolated edge (i.e. a double slit filter) the filter can be matched to the instantaneous image of a double bar target. The two bars should be unresolvable to the projection NA (Numerical Aperture) but clearly resolved by the collection NA. This pattern can be collected many times during a scan improving the signal-to-noise ratio.

The spatial filter is of the electronic variety such as a CCD array, or mechanical variety such as sliding shutters.

The alignment system configuration is used for dimensional metrology measurement of integrated circuit patterns.

The alignment system is used to provide automatic focussing feedback to position stages for a positioning application.

The collection and illumination apertures to form confocal images for detector array filtering can be adapted in real time to optimize measured overlay results or the Figure of Merit.

In a preferred aspect of the invention, a system with one or more axes of physical scan motion are replaced by a virtual scan operation. The virtual scan motion resulting from orienting the projected reference slit image at an angle to the CCD array axis and the alignment mark being viewed, by electronically projecting the CCD array pixels along the axis for the alignment mark under inspection, the centerline of said alignment mark being localized with no physical motion of detector or target.

BRIEF DESCRIPTION OF THE DRAWINGS

FIGS. 3A and 3B are made for a polyimide film element and FIGS. 3C and 3D are for a silicon membrane.

FIG. 5A shows the enhanced resolution with the confocal reversed darkfield.

FIG. 6A is similar to FIG. 5A but a different asymmetry is introduced into the resist. FIGS. 6B-6E show individual images from FIG. 6A.

DESCRIPTION OF THE PREFERRED EMBODIMENT

CONFOCAL REVERSE DARKFIELD SYSTEM

In an embodiment of the present invention, an alignment system is made to discriminate against light scattered from features extraneous to alignment marks. This is accomplished with a spatial filter in the image plane that is matched to the image of a centered alignment mark, as projected through darkfield illumination and collection pupils. As often happens in microscopy, the addition of this single new component fundamentally changes the character of the system. The spatial filter accesses the information contained in the time-varying instantaneous image of the reflected spot or slit. Much of this information is lost when the image is simply integrated as in conventional RDF (reverse darkfield) systems.

Figure 1:
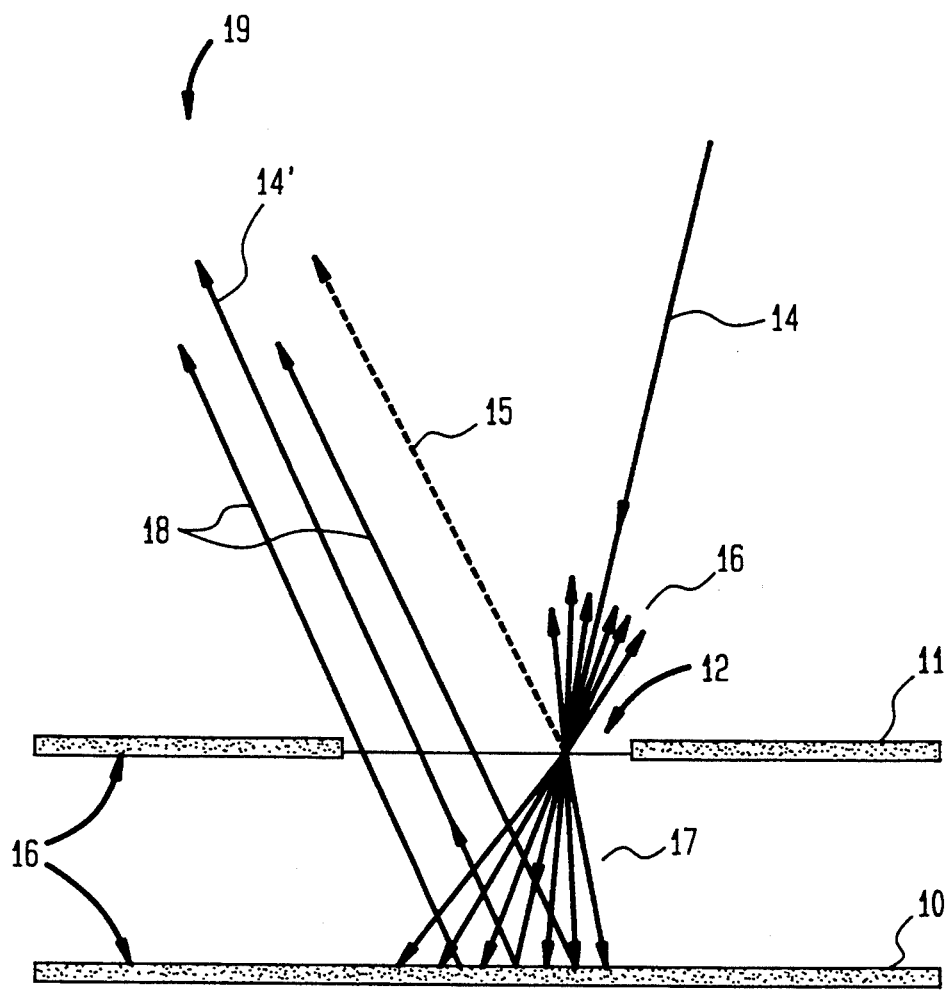
FIG. 1 shows a schematic, elevational, view of a prior art optics with the backscatter and reflected optical noise illustrated.
Figure 2A:
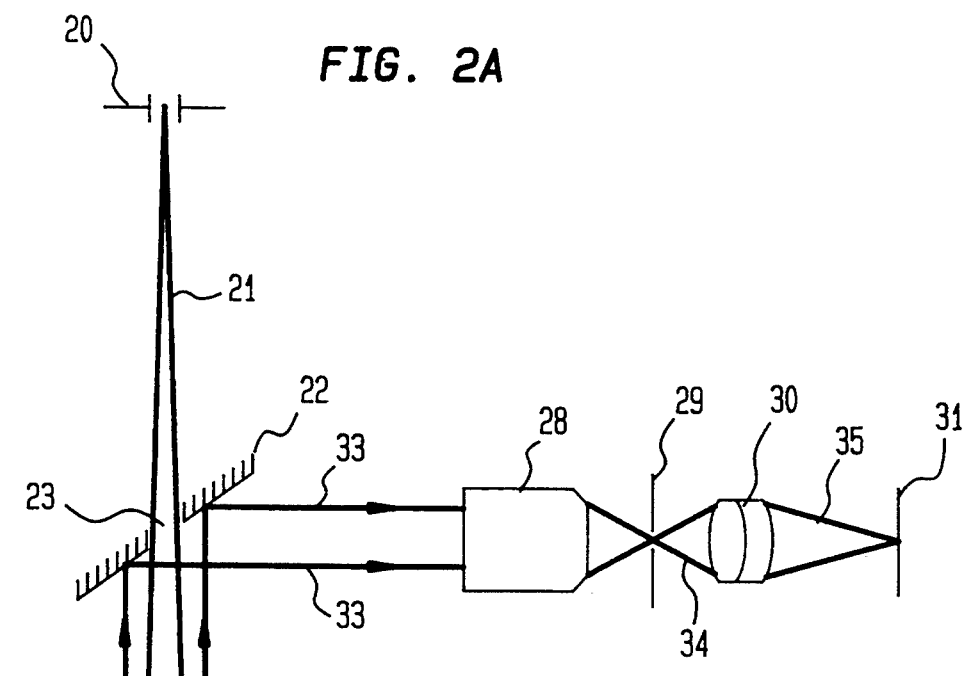
FIG. 2A shows a reverse darkfield (RDF) microlithography alignment system with a confocal spatial filtering system that discriminates against topographical features other than the alignment mark.

A new system embodying the present invention is illustrated in FIG. 2A in a physical aperture based embodiment. An illumination pupil is used to project onto the wafer 27 a sharp image of a subresolution aperture, generally resembling a slit pattern, or an array of slits. The collection pupil then forms an image on the spatial filter of those scattering features that lie within the illuminated volume; specularly reflected light is not collected. Only after passing through the spatial filter is the total energy in the image collected to form the alignment signal at a particular position in the scan. Principal rays of illumination 21 pass from a sub-resolution aperture 20 through aperture 23 in RDF (reverse darkfield) mirror 22. The rays 21 then pass to objective, imaging lens 24 where rays 21 converge into beam 25 which passes through mask 26 to wafer 27. The reflection of beam 25 passes as beam 32 back up though lens 24 to reflect from the back of mirror 22 to the right as beam 33, which passes through relay (tube lens) 28 emerging as beam 34, passing through confocal aperture 29 then through relay lens 30 to produce beam 35 directed onto detector 31. Detector 31 As in the form of a photomultiplier tube or diode 31.

Figure 2B:
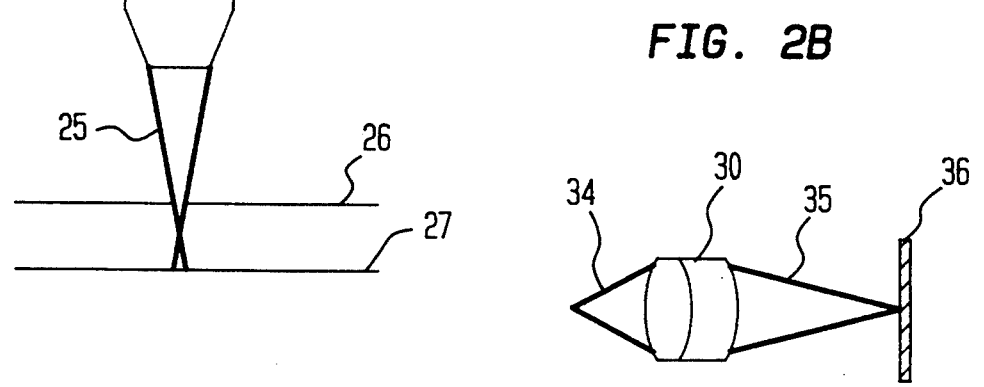
FIG. 2B is a modification of the detector of FIG. 2A which provides a substituted CCD device for confocal filtering via a pixel weighting matched to the optical system. The confocal filtering system employs empirical filter optimization accomplished by correlating stored images with resulting overlays.

FIG. 2B shows a substituted CCD based embodiment with a CCD array 36 for receiving beam 35 from relay lens 30 without any intervening physical spatial falter as with confocal aperture 29. In other words, it is possible to replace the physical aperture detector pair with a CCD based virtual filter.

Confocal filtering is accomplished in one embodiment of the present invention using a physical aperture matched to the instantaneous image of an aligned mark edge. The contribution to the instantaneous image from extraneous features like resist overcoats and grainy structures As quite different in shape from the contribution due to the mark edge. The confocal filter 29 is designed to discriminate in favor of the latter signal, providing an overall alignment signal that is less easily biased by the presence of other features. The signal pulse associated with each mark edge is also sharper, due both to background suppression by the filter, and to the intrinsically higher resolution of diffraction-limited confocal systems at a given Numerical Aperture (NA) and wavelength.

Alignment of a physical aperture with the optical axis can be difficult, and the filter function cannot be changed except by switching apertures and realigning the system. In a preferred embodiment of this invention, the confocal darkfield system is made more powerful by using a CCD array instead of a physical filter. (Though CCD's are quite suitable for the spatial filtering function, the present concept is compatible with a wide range of imaging detectors.) In this embodiment, the signal from the different pixels in the array is weighted to create a virtual spatial filter. In the simplest case, the weighting simulates a spatial filter matched to the image of an undistorted alignment mark edge. Signals extraneous to the alignment mark will then be digitally rejected. Since the filter is reprogrammable, it can be optimized for width, symmetry and noise rejection from level to level. Unfiltered instantaneous images can be stored and compared off-line to overlay measurements taken later at each level, allowing empirical improvement of the filter function. One can also program a CCD-based alignment system to open the alignment filter to a wider fraction of the image plane when alignment signals are weak, thereby averaging the signal over a wider area.

Theory and Experimental Data

Figure 3A:
FIGS. 3A-3D are graphs of experimental results illustrating that optical noise can be greatly reduced and sufficient focal plane isolation achieved to image through a silicon membrane.
Figure 3C:
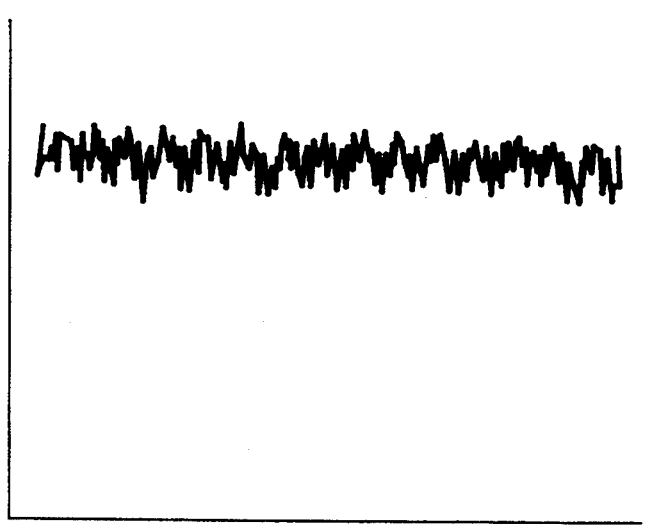
Figure 3B:
Figure 3D:
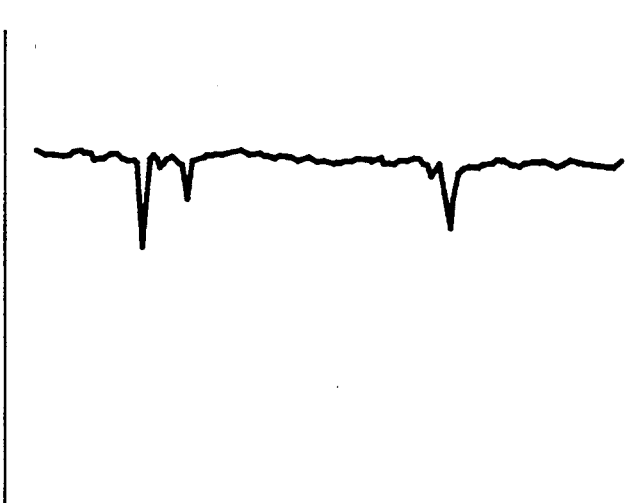

The spatial filter strongly discriminates against light scattered from features or system defects that are located at a large distance from the center of the illuminated pattern. FIGS. 3A-3D are graphs of experimental results illustrating that optical noise can be greatly reduced and sufficient focal plane isolation achieved to image through a silicon membrane. The ordinate (vertical) axes are voltage, representing alignment signal intensity and the abscissa are time in nanoseconds. FIGS. 3A and 3B are made for a polyimide element and FIGS. 3C and 3D are for a silicon membrane. In the cases of FIGS. 3A and 3C, no filter is used and the data is very noisy. In the cases of FIGS. 3B and 3D, a filter is used and the data is much cleaner. When the mark edge is centered in the scanned illumination, the images of other features are not centered on the spatial filter, and so are largely blocked. Such discrimination is characteristic of confocal scanned optical systems, which form the image signal by collecting the intensity at a "point detector", instead of collecting the entire image intensity. The same effect is obtained by passing the image through a small pinhole.

This background discrimination can be further improved by optimizing the spatial filter to pass only the spot image arising from a sharp step in perfect alignment with the illumination aperture (the step representing an alignment mark). In this case the filter will not pass with high efficiency the light scattered by other kinds of features, even if these features lie very close to the mark edge.

For example, the instantaneous darkfield image of a single alignment mark edge takes the form of two sharp peaks, with additional weaker peaks, whose intensity is maximum when the edge is centered under the illumination. At this point in the scan, the midpoint between the peaks (a dark fringe in the image) is centered on the spatial filter.

Figure 4A:
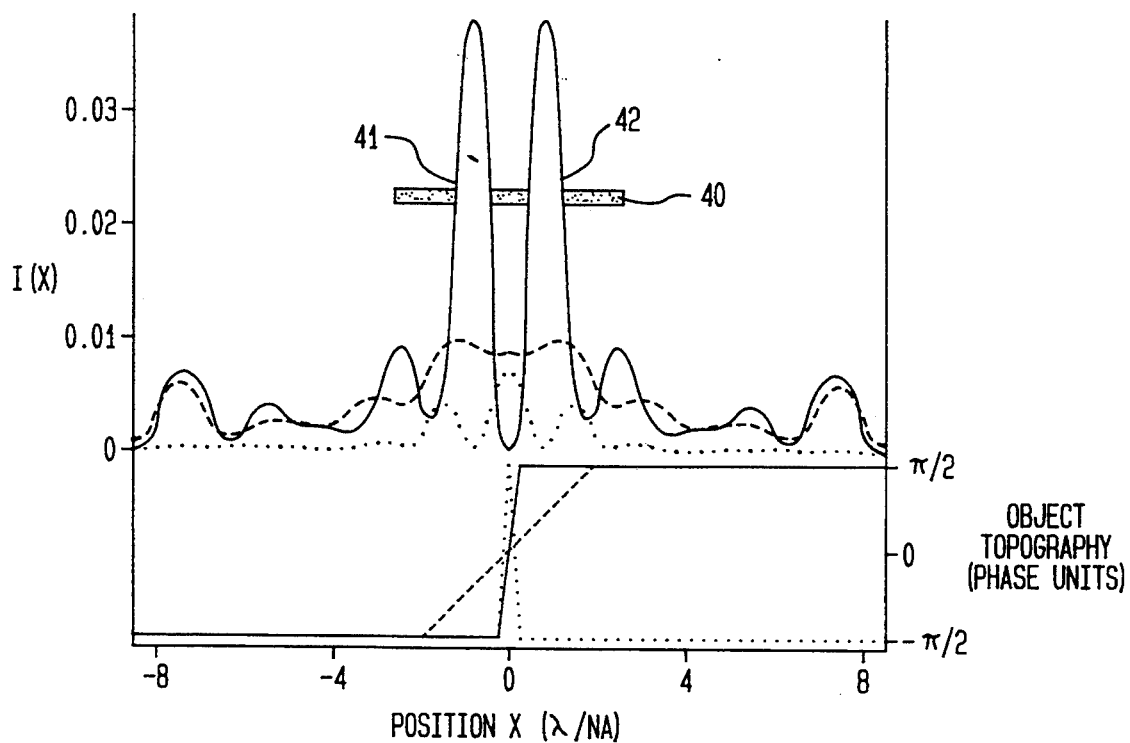
FIG. 4A shows a reverse darkfield, confocal, spatial filter in accordance with this invention.

Referring to FIG. 4A, a spatial filter consisting of two open slits aligned with the peaks will transmit a strong pulse to the detector at this point in the scan.

In contrast, the instantaneous image projected on the filter from a more gentle phase slope, such as that impressed in the resist overcoat by the underlying mark, is quite broad, either featureless or with peaks of very low contrast. Relatively little of this light will pass through the two slits. The instantaneous image of a filament-lAke or grain-lAke scatterer forms a sharp single peak, which largely falls between the two slits of the spatial filter at the scan position where the intensity is maximum; thus such extraneous scattering is largely blocked.

These instantaneous images are plotted in FIG. 4A. FIG. 4A shows a double spatial filter 40 with slits 41 and 42 for a darkfield confocal system.

The legend for the curves shown is as follows:
—solid curves refer to an alignment mark edge.
- - - dashed curves refer to a resist sidewall
. . . dotted curves refer to a single pixel object, In order to emphasize that the strong difference between the instantaneous images of these different features arises from very basic considerations, the calculations have been carried out with a simple scalar model, in contrast to the more rigorous E&M calculations presented below. For simplicity, the interfacial reflectivities of the different objects have all been set equal to one another in magnitude (to unity). The phase of the interfacial reflectivity is proportional to the object height $z(x)$;

$$\phi(x) = 4\pi z(x)/(L)$$

where
z is object height
(x) is is the horizontal position
$\phi$ is optical phase delay, and
(L) is the wavelength Lambda.

It is plotted beneath each image for the three objects considered. The total modulation depth is set to (L)/2 for each object, in order to maximize the image contrast. The images are shown at the scan position corresponding to the nominal peak alignment signal. The images are normalized against the intensity in the illuminating spot. The differences in image intensity arise entirely from the imaging properties of the alignment system; the effect of material-dependent Fresnel reflectances has not been included. Letting h(x,y) represent the impulse response of a lens, i.e., the response of a lens to a pulse input (Fourier transform of the corresponding pupil), and assuming a subresolution scan slit, the instantaneous images at time t during the scan are calculated as:

$$I(x,y;t) = |(h_{Illum}(x,y) \, e^{[i\phi(x,y,t)]}) \blacklozenge h_{Collec}(x,y)|^2,$$

where

◆ denotes convolution.

Figure 4B:
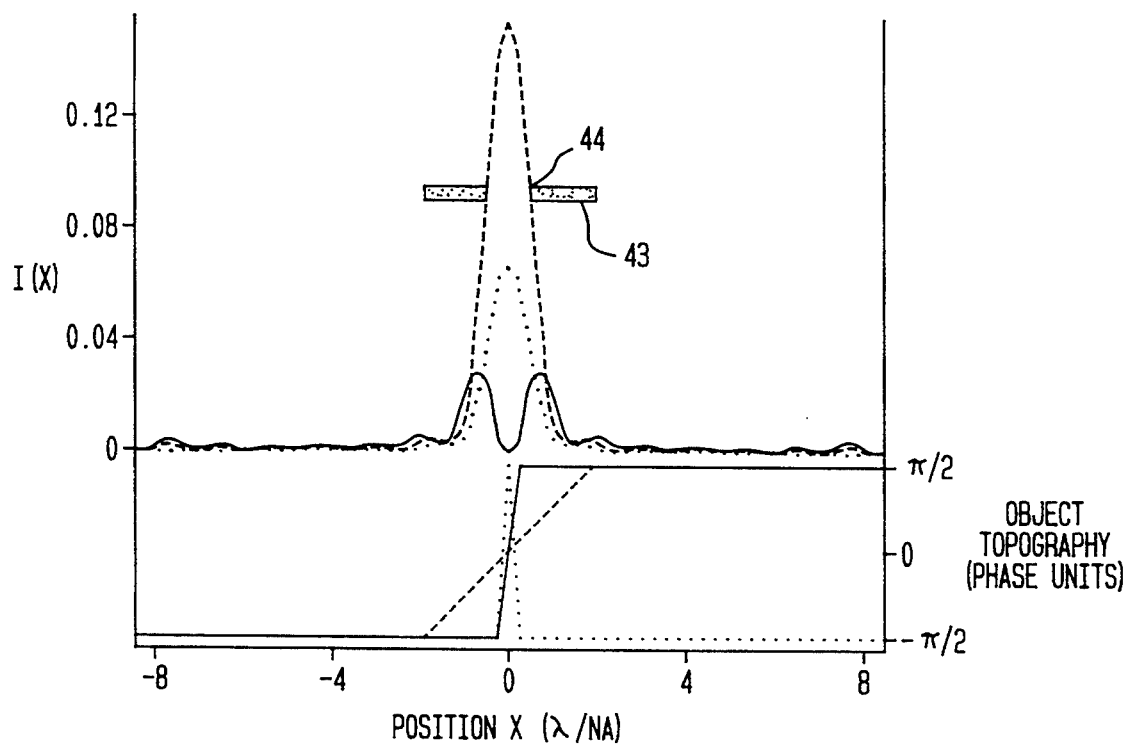
FIG. 4B presents contrasting results for the more familiar bright-field confocal optics.

$h_{Illum}$ is impulse response for the illumination section of the lens (x,y) cartesian coordinates i square root of −1

φ optical phase delay t time $h_{Collec}$ Impulse response for the collection section of the lens FIG. 4B presents contrasting results for the more familiar bright-field confocal optics with a mask 43 and a single slit 44. The key for FIG. 4A applies to FIG. 4B. The darkfield system of FIG. 4A clearly provides better capability of discriminating in favor of the alignment mark. More generally, these calculations illustrate that significant information is contained in the instantaneous image formed by scanned slit illumination. This instantaneous image is fundamentally different in character from either the darkfield image formed by a conventional darkfield microscope, or from the overall darkfield alignment signal scanned out by the system over time.

Figure 5A:
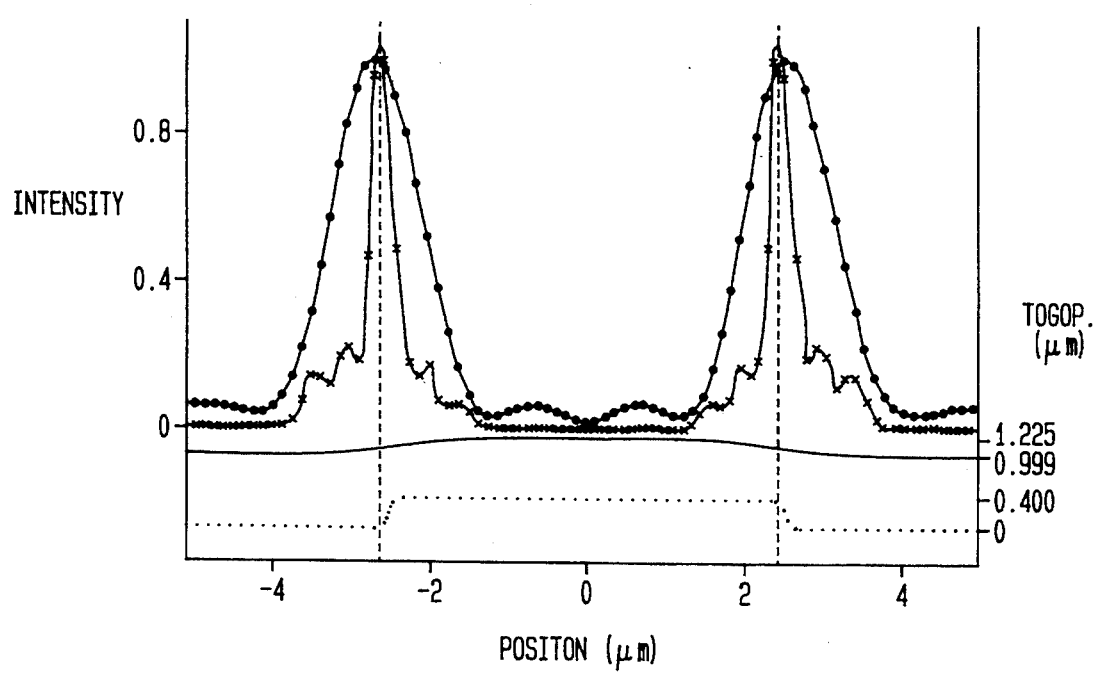
FIGS. 5A and 5B compare the standard reverse darkfield with the confocal reverse darkfield.
Figure 5B:
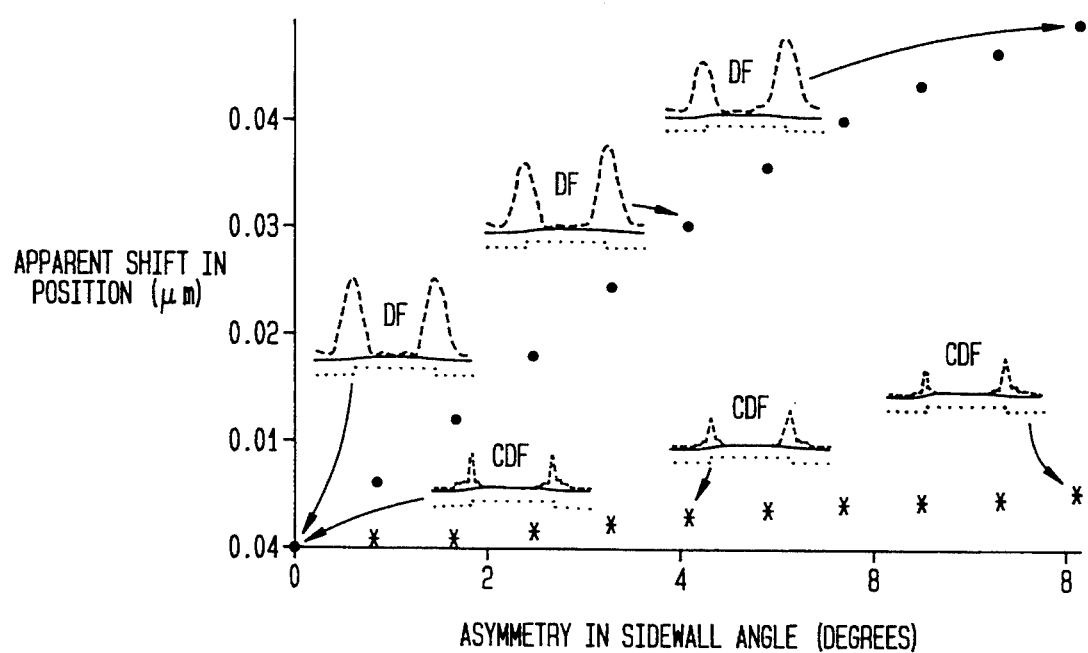

In the case of a structural feature lying very close to a mark edge, such as modulation in a resist overcoat, the mark and resist overcoat are actually integral parts of a single complicated alignment object. Nonetheless, simulations suggest that the confocal darkfield system does in fact provide reduced sensitivity to resist overcoat variations, as explained by the arguments above. This is illustrated in FIGS. 5A and 5B. FIG. 5A shows intensity plotted as a function of position in μm of normalized RDF(reverse darkfield) and confocal darkfield (CDF) alignment signals. The alignment mark has a symmetrical resist overcoat.

The key to the symbols on the graph are as follows:
 ○ scanned DF (darkfield)
 × CDF (confocal DF).

FIG. 5B is a plot of apparent shift in position in μm as a function of asymmetry in sidewall angle in degrees. FIG. 5B shows the effect of resist asymmetry on alignment signals. The leftmost point in the plot is the equivalent to FIG. 5A. At each successive point to the right, the slopes to the left and right resist sidewalls are respectively incremented and decremented. The shift in apparent image position is plotted using a standard threshold algorithm for location. The key to the symbols on the graph are as follows:
 Reverse Darkfield
 * Reverse Confocal DF (Darkfield)

To make the computational problem tractable, the simulations assume a one-dimensional optical system and a monochromatic source, even though a broadband source might be preferred. However, a full E&M (Electromagnetic) solution to Maxwell's equations is used.

FIGS. 6A–6E show the result of spatial filtering with a weighting function that matches the instantaneous image of a nominal alignment mark. The weighting filter is based on an average from both edges of the mark. Additional images with this fixed filter function are then calculated as the resist overcoat is asymmetrically altered by translating the resist slope outward on one edge of the mark (the left edge). As FIG. 6 shows, the signal peak tracks the mark edge more closely with spatial filtering than with standard RDF imaging, so long as the resist asymmetry is below about 0.7 μm.

Figure 6A:
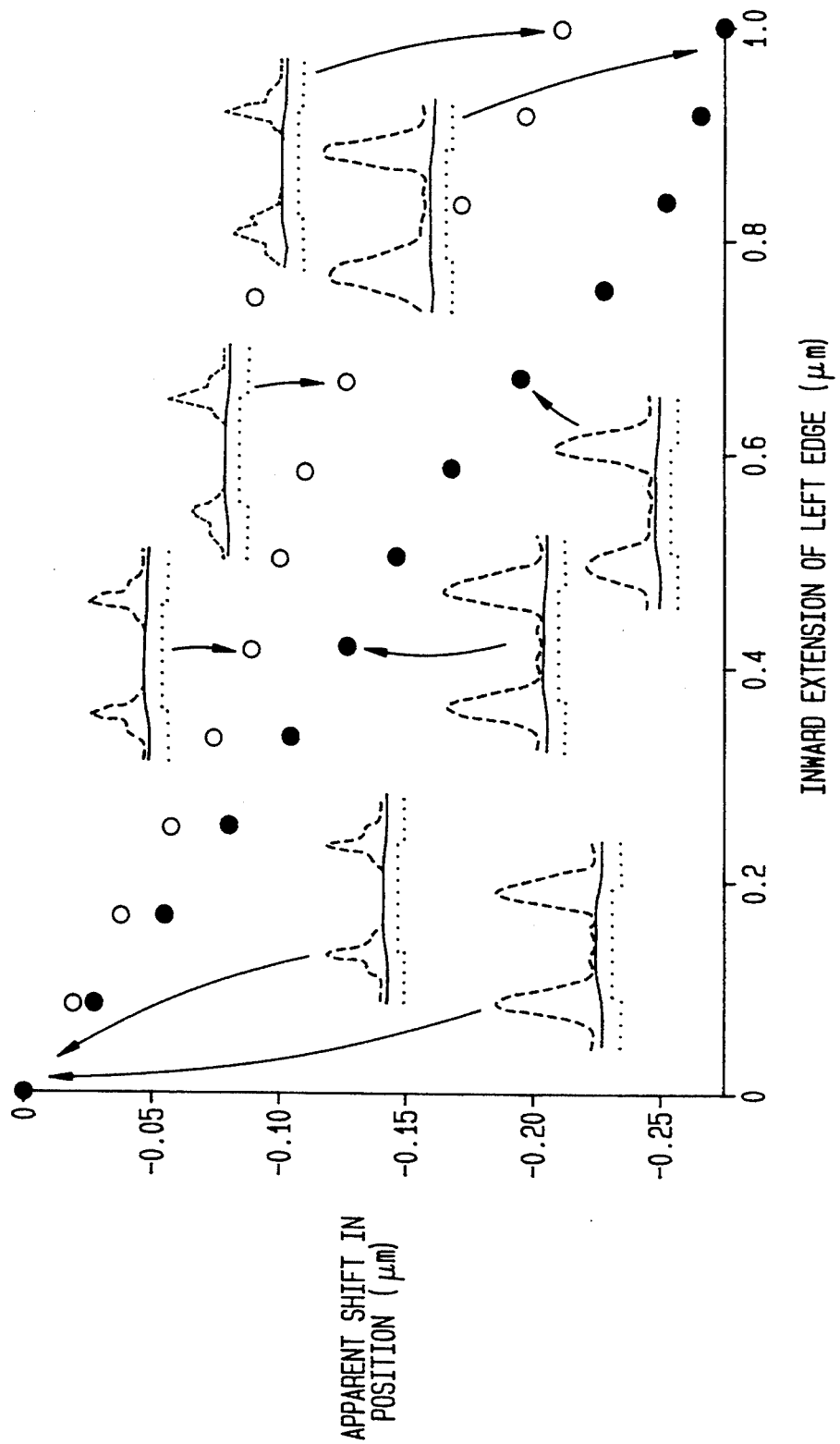
FIGS. 6A-6E show the result of spatial filtering with a weighting function that matches the instantaneous image of a nominal alignment mark.
Figure 6B:
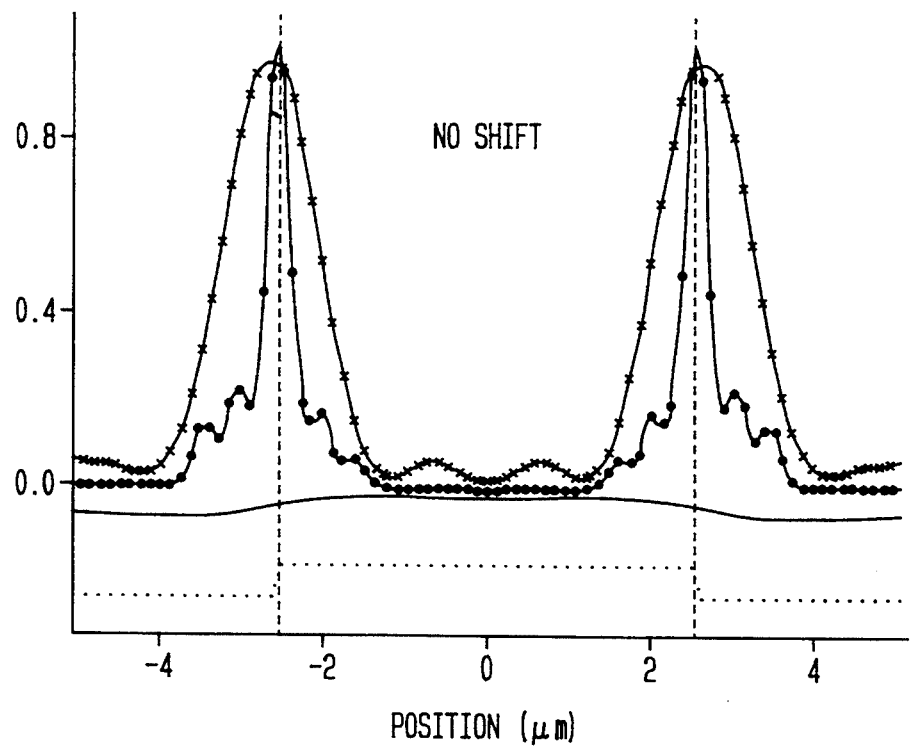
Figure 6C:
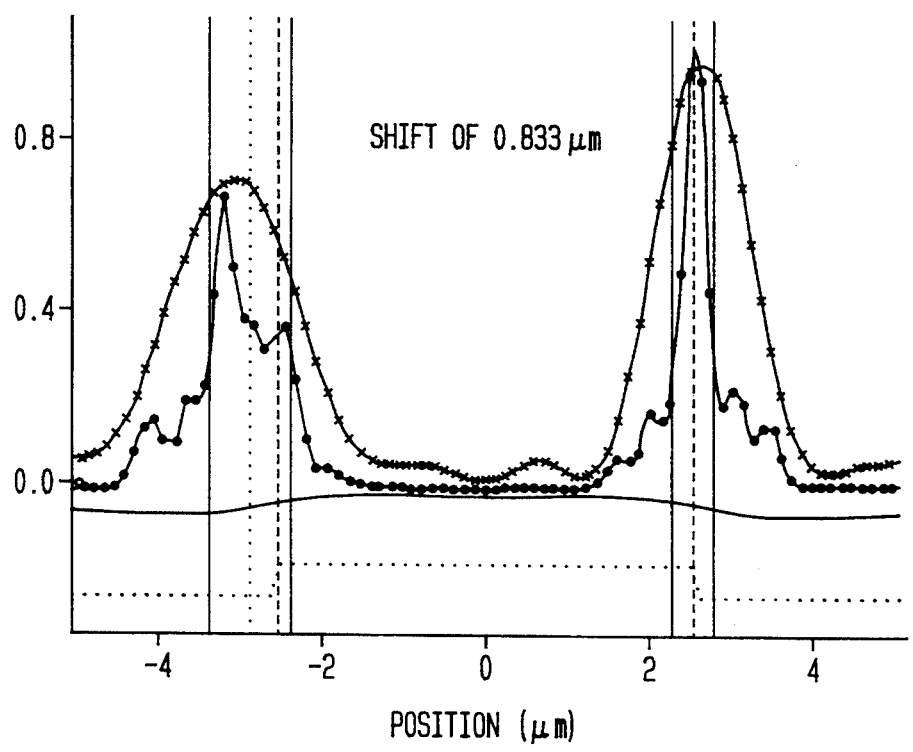
Figure 6D:
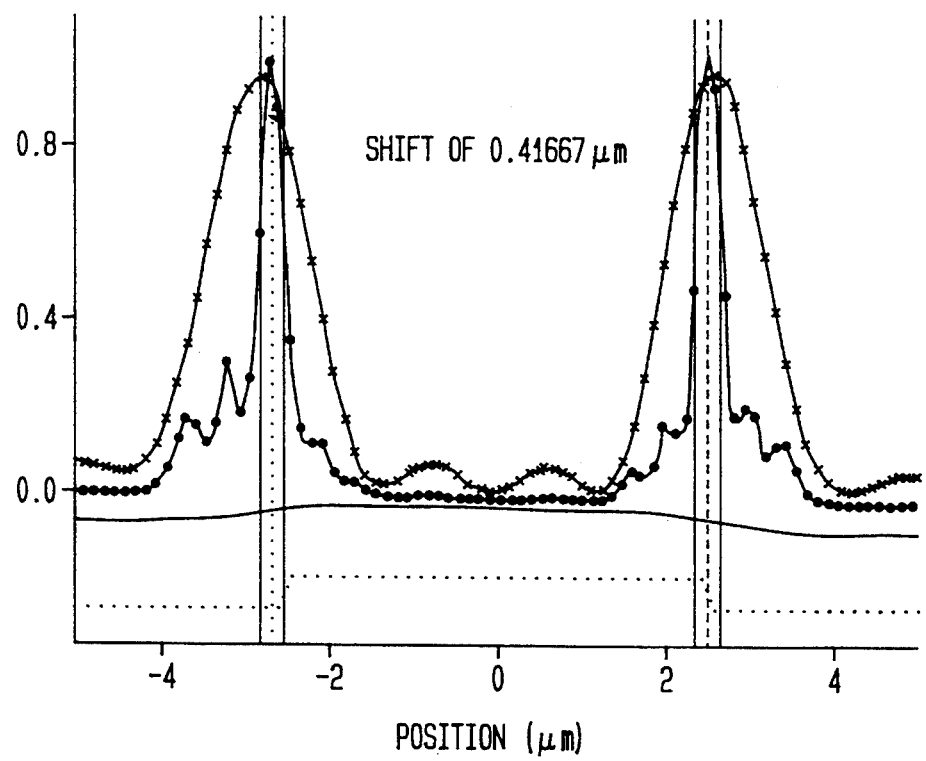
Figure 6E:
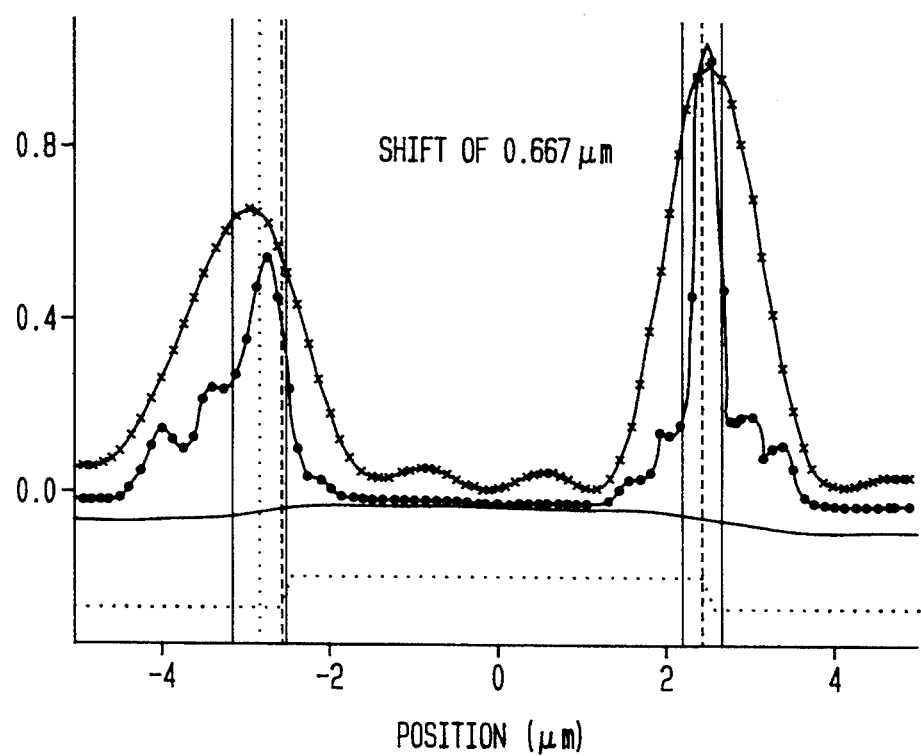

FIG. 6A is similar to FIG. 5A but a different asymmetry is introduced into the resist. The key to the symbols on the graph of FIG. 6A are as follows:
 Scanned DF (Darkfield).
 ○ Confocal DF (Darkfield)

At successive points, the left resist sidewall is progressively translated leftward in equal increments, leaving the slope unchanged ("resist pile-up".) The images are consistently normalized with one another, so that signal intensities in the two alignment modes can be compared directly.

FIGS. 6B–6E show individual images from FIG. 6A. Each plot is labeled in the center, with the associated resist sidewall translation. The vertical lines at each edge are generated by the threshold algorithm during location of the alignment pulse from the edge. Edge location for the confocal case only is shown; the numerical results for the RDF case are plotted in FIG. 6A. The dotted vertical line at the left edge is the measured left edge position. Visual comparison of the left edge pulses in the RDF and confocal signals shows that the confocal signal is locked quite strongly to the mark edge, in the images where the resist deformation is 0.67 μm or less, but in the 0.67 μm image, the disturbance in the resist object has begun to exceed the range of the sharp filter function used in these examples. Though edge tracking with the confocal peak remains slightly better than with RDF, the shape of the peak loses all regularity at large displacement. This can be corrected by real-time adjustment of the filter function.

The key to the symbols on the graphs of FIGS. 6B–6E are as follows:
 Symmetry Seeking CDF
 × Scanning Darkfield For modest variations, the confocal peak remains considerably sharper than the peak from the conventional scanned system, whose resolution is significantly blurred by the resist overcoat. The scalar response function for this 1D lens in a conventional RDF mode is a sinc, i.e. sinx/x, function with a 1.2μ FWHM (Full Width Half Maximum), but the RDF response when the mark is coated is significantly broader. This is observed in practice as well. The confocal system eliminates much of this broadening for moderate excursions in the resist topography from nominal (i.e. within the central region of the process window), and shows smaller alignment offsets.

For larger asymmetries, the confocal signal deteriorates significantly. However, the alignment software can easily be programmed to reject such a poor quality signal. It can instead be programmed in these cases to generate the alignment signal by summing over a wider window within the pixel array. A substantially wider window can still provide significant filtering against diffuse stray light, while the signal shape approaches that of the standard darkfield system.

The CCD system allows considerably more powerful processing algorithms to be employed. For example, when a particular process level is first encountered, the instantaneous image as a function of scan position can be stored. After a few sample wafers are processed, overlay measurements can be used to determine the position of the underlying mark edge relative to each instantaneous image. An optimized spatial filter can then be determined empirically as that unbiased filter function which provides the most accurate determination of edge position. It is possible to steadily hone the weighting function for each level as overlay experience accumulates.

Still further refinements are possible. For example, the weighting function itself can be varied according to the measured shape of the instantaneous image. During the empirical training phase described above, the system could determine an optimized weighting matrix instead of a simple vector of weights, where the matrix would provide the weighting function through multiplication by the instantaneous image. The required matrix and vector multiplications on the alignment signal can be accomplished very quickly using modern hardware.

In a further embodiment of the invention, the confocal channel can be supplemented by an alignment channel in which a detector array is sufficiently defocused to provide far-field directional information about the scattered light, providing further input to the signal processing algorithm.

A typical CCD (Charge Coupled Device) array contains a sufficient number of pixels to process many alignment channels in parallel. This can support multiple slit confocal apertures that increase the instantaneous signal.

Figure 7:
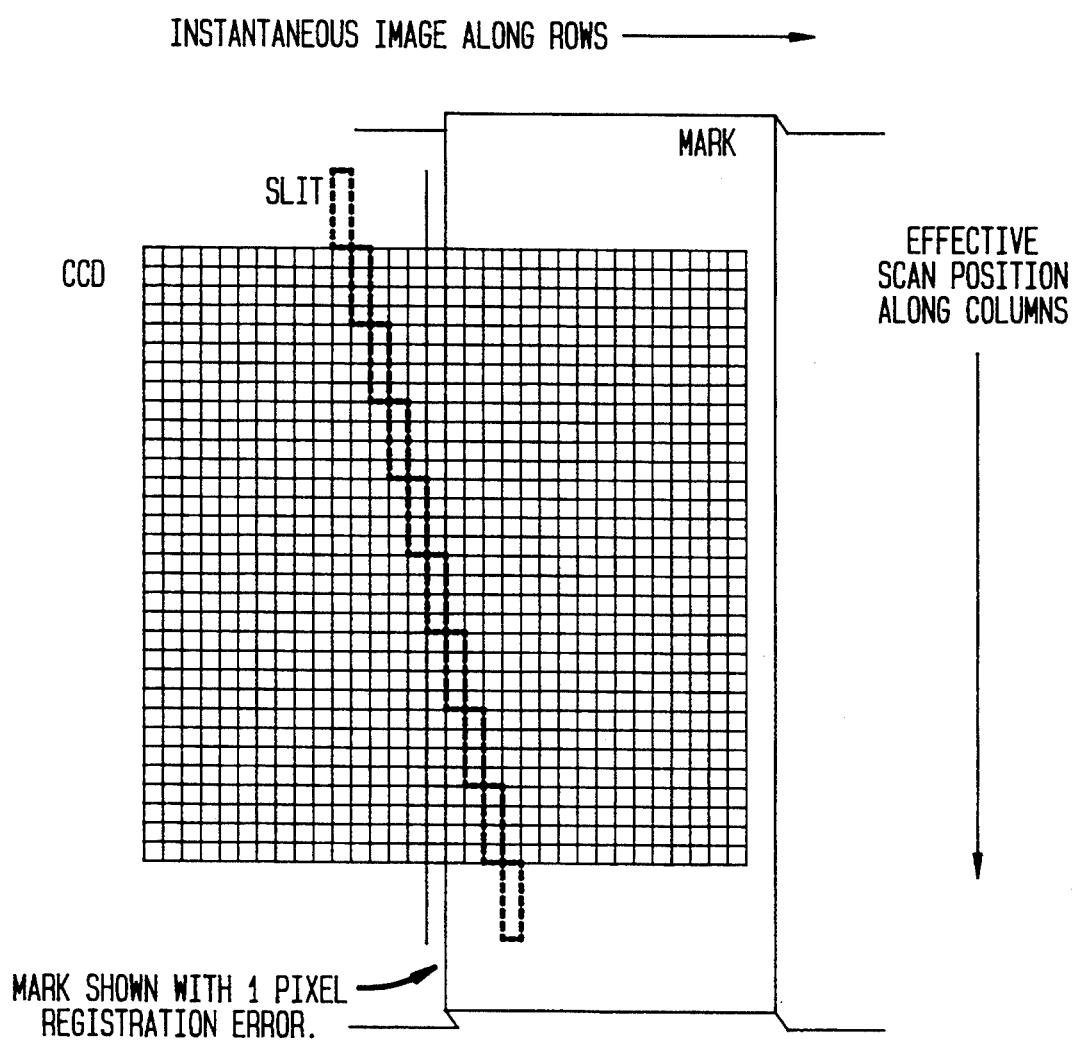
FIG. 7 shows that when alignment is accomplished with a "virtual" scan instead of physical motion, under broadband visible illumination, the photon flux can be very high, allowing the use of greatly reduced effective slit length. Once global alignment is achieved, the required effective scan length is greatly reduced since mask and wafer are then nearly aligned. This allows the scan to be multiplexed along the slit length, as shown in FIG. 7.

Another advantage of CCD based darkfield over prior art is the possibility of simplifying the scan motion necessary in reverse darkfield systems. For example, one axis of scan can be eliminated by processing one axis as a full-field darkfield channel and the second axis as a scanned confocal darkfield channel. In fact, with broadband visible illumination, the present system allows the scan to be entirely eliminated after the first alignments are made. Alignment can then be accomplished with a "virtual" scan instead of physical motion. Under broadband visible illumination, the photon flux can be very high, allowing the use of greatly reduced effective slit length. Once global alignment is achieved, the required effective scan length is greatly reduced since mask and wafer are then nearly aligned. Referring to FIG. 7 a system with one or more axes of physical scan motion are replaced by a virtual scan operation. The virtual scan motion resulting from orienting the projected reference slit image at an angle to the CCD array axis and the alignment mark being viewed, by electronically projecting the CCD array pixels along the axis for the alignment mark under inspection, the centerline of said alignment mark being localized with no physical motion of detector or target. Of course, if the system then determines the alignment to be out of tolerance, a physical motion is still required to achieve registration.

Preferred Embodiment

As discussed above, the software required to process the alignment signal in confocal darkfield alignment can range from a simple spatial window that is overlaid on standard pulse timing algorithms, to very sophisticated processing of an overlay and image database. In most respects, the hardware required is available off the shelf, and the system is engineered in much the same way as a conventional RDF system. Two new engineering challenges for a confocal system are, as follows:

first, to maintain registration between the instantaneous image and the spatial filter (or equivalently, between the illuminating aperture and the spatial filter) in the presence of possible vibration or thermal drift, and second, to maintain an adequate signal to noise ratio in the alignment signal.

Equivalent problems have been solved in other applications. For example, a commercially available confocal microscope maintains registration between independent illumination and collection pinholes, to within tolerances appropriate for integrated circuit alignment. As far as radiometry and SNR (signal-to-noise ratio) are concerned, others have built a detection system which, in about 1 second of integration time, is capable of mapping out the point spread function of lithographic lenses. This system uses a relatively noisy camera, uses only a single UV mercury line for illumination, and uses a pinhole test aperture that is subresolution in both dimensions. Though shorter integration times are required in confocal alignment, broadband illumination can be used, and the image which must be mapped out is narrow in only one dimension.

The aperture/filter registration problem is amenable to direct solution, so long as the system remains stable for short times. Any drift in registration between the aperture and spatial filter can quickly be corrected by scanning a mark of the wrong orientation into the slit image. The position of the reflected image on the detector array then provides the position along the scan direction at which the weighting function should be centered. (The position along the other axis is not critical.) The same technique can be implemented with a physical filter if the filter or aperture fiducial is mounted on a fine positioner. Fluence requirements are not critical during the above calibration operation, since a high contrast fiducial object and long integration times can be used.

In contrast, for practical throughput, the basic alignment scan must be completed in ≈250 msec. Longer times can be allowed for the first one or two alignments. Once the wafer or mask is positioned by these initial alignments, the position of succeeding marks is known quite well, and later scans can be initiated very near the mark. Surprisingly few measurements are required for adequately characterizing the intensity on each pixel as a function of time, e.g. to be safe one might form the signal from 64 points. At one video frame per scan point such a signal would take about two seconds to acquire, but with a delay-and-integrate scheme this could be speeded up significantly. For example, for scans of single frame duration one could read out the contents of each row (for a vertically oriented scan slit) with the delay time for each row chosen in such a way that the integration time for each row rises from 0 at the top row to 1/30th second at the bottom row. The derivative of the signal along each column would then give the time variation at a particular position in the image. All such derivatives along a row at some instant then provide the instantaneous image at that moment.

The low noise levels in modern CCD arrays greatly ease intensity requirements. If necessary the CCD can be calibrated for nonuniformity and nonlinearity during tool setup, though with modern CCD chips this may not be necessary. Broadband illumination in the visible (or even infrared) provides both the advantage of resist transparency, and also a smoothing of the signal variabilities that are associated with monochromatic illumination. Broadband visible illumination should also make it easy to achieve high signal-to-noise ratios in confocal alignment systems. For instance, if we approximate a 200 W Hg lamp as a 4800° K. blackbody, each $(L)^2$ area of the arc surface emits about 6E12 photons per second between 5500 Å and 7000 Å. (This effective temperature is an approximate fit to vendor lamp specifications.) It follows from radiometry that in one second an illuminating lens will deliver about this same number of photons, 6E12, to each diffraction-limited resolution element in the image. Taking the case of a 0.6 NA lens with the center half forming the NA for illumination, the resolution for one wavelength is as follows:

$(\bar{L}) = 6350$ Å is about 1.25 μm.

Allowing 0.2 seconds for signal acquisition, and assuming the alignment mark to have 500 μm of edge length (which is 400 resolution lengths), we find that the total number of photons delivered to the slit image on the wafer is about 5E14. In practice the slit need not really be subresolution; a slitwidth of 0.5 (L)/NA is quite acceptable and will provide transmittance $\approx 1$. Nonetheless, if we assume an efficiency of only 0.01 in the illumination step, the resulting 5E12 delivered photons corresponds to about 250 milliJoule/cm$^2$. This is quite acceptable within the range of the visible spectrum where the resist is not exposed, and the assumed 1% efficiency is pessimistic. If we also assume a 0.001 darkfield image intensity under conditions of weak scattering from the wafer, and a further 0.01 efficiency in imaging the collected light onto the CCD array (N. B.—both assumptions are quite pessimistic), then the image at the detector contains about 5E7 photons. With anamorphic optics to compress the image into 512×30 pixels, this comes to about 3000 photons per pixel. With a thermoelectrically-cooled CCD camera (i.e. solid-state cooling, no external cooling required), the dark current at −50° C. is only 1 or 2 electrons per pixel in 0.2 seconds. The SNR is thus shot-noise limited, meaning that the position of the signal can be registered within a small fraction of lens resolution.

What is claimed is:

1. A microlithography system comprising:
   illumination means for projecting a sharp image of a subresolution aperture onto an alignment target;
   means for scanning said alignment target through said sharp image at a plurality of scan positions;
   means for blocking collection of light directly reflected from said alignment target;
   collection means for collecting light scattered from the vicinity of said alignment target at each said scan position; and
   detection means for integrating and filtering said collected light, said integrated collected light being filtered to provide an alignment signal pulse at an edge of an alignment pattern.

2. A microlithography alignment system as in claim 1 wherein said detection means comprises a two dimensional CCD detector array.

3. A microlithography system as in claim 1 wherein said detection means comprises a two dimensional diode array detector.

4. A microlithography alignment system as in claim 1 wherein said collection means comprises a darkfield collection lens pupil aperture.

5. A microlithography system as in claim 4 wherein said aperture is a slit.

6. A microlithography system as in claim 5 wherein said aperture comprises a pair of slits.

7. A microlithography alignment system as in claim 6 wherein said detection means comprises a two dimensional CCD detector array.

8. A microlithography exposure arrangement comprising:
   an illumination source;
   a subresolution aperture;
   a Reverse Darkfield (RDF) mirror;
   an aperture in said RDF mirror;
   an imaging lens, whereby light from said illumination source is passed through and shaped by said subresolution aperture, then passed through said RDF mirror aperture to said imaging lens and focussed by said imaging lens into a beam, said beam being directed by said imaging lens through a mask to a wafer and reflected therefrom;
   a tube lens;
   a confocal aperture;
   a relay lens; and,
   a detector, whereby said reflected beam is passed back through said imaging lens to said RDF mirror, a portion of said reflected beam being reflected by said RDF mirror at an angle to said reflected beam, said portion being passed through and focussed by said tube lens and forming a second beam, said second beam being directed to and passing through said confocal aperture to said relay lens, said relay lens refocussing and directing said beam onto said detector.

9. The arrangement of claim 8 wherein said detector is a photo-multiplier tube.

10. A microlithography exposure arrangement comprising:
    an illumination source;
    a subresolution aperture;
    a Reverse Darkfield (RDF) mirror;
    an aperture in said RDF mirror;
    an imaging lens, whereby light from said illumination source is passed through and shaped by said subresolution aperture, then passed through said RDF mirror aperture to said imaging lens and focussed by said imaging lens into a beam, said beam being directed by said imaging lens through a mask to a wafer and reflected therefrom;
    a tube lens;
    a relay lens; and
    a detector, whereby said reflected beam is passed through said imaging lens to said RDF mirror, a portion of said reflected beam being reflected by said RDF mirror at an angle to said reflected beam, said portion being passed through and focussed by said tube lens and forming a second beam, said second beam being directed to said relay lens, said relay lens refocussing and directing said beam onto said detector.

11. The arrangement of claim 10 wherein said detector is a CCD virtual filter.

* * * * *